United States Patent

Ritchie et al.

[15] 3,666,729

[45] May 30, 1972

[54] PLATING RESIST SOLUTION

[72] Inventors: Kim Ritchie, Cave Creek; Yvonne Cecile Malkiewicz, Phoenix, both of Ariz.

[73] Assignee: Motorola, Inc., Franklin Park, Ill.

[22] Filed: July 2, 1970

[21] Appl. No.: 52,074

[52] U.S. Cl. ..........................260/78.4 EP, 117/6, 260/78.44

[51] Int. Cl. ..........................C08f 3/60

[58] Field of Search ............260/78.4 UA, 78.4 EP, 78.5 UA, 260/830 R, 75 EP

[56] References Cited

UNITED STATES PATENTS

| | | | |
|---|---|---|---|
| 3,249,656 | 5/1966 | Kalinowski et al. | 260/885 |
| 3,385,836 | 5/1968 | Mednick et al. | 260/78.4 |
| 3,397,254 | 8/1968 | Wynstra et al. | 260/835 |

*Primary Examiner*—Joseph L. Schofer
*Assistant Examiner*—J. Kight, III
*Attorney*—Mueller and Aichele

[57] ABSTRACT

A catalyst-free, solvent-free plating resist solution consisting of a diallyl phthalate prepolymer having a molecular weight of about 4900 and a liquid epoxy compound such as 1, 2-epoxy ethylbenzene is disclosed. The plating resist solution contains about 0.1 to 3 parts by weight of the diallyl phthalate prepolymer to one part by weight of the liquid epoxy compound.

7 Claims, No Drawings

PLATING RESIST SOLUTION

BACKGROUND OF THE INVENTION

This invention relates to a plating resist solution and more particularly to a catalyst-free, solvent-free plating resist solution.

Conventional plating resist solutions contain a prepolymer, a catalyst, a solvent and in some cases, a filler. The solvent is used to regulate the viscosity of the solution. A solvent, however, is undesirable because it evaporates during the curing cycle to form bubbles in the plating resist layer. Plating resist formulations containing a catalyst are also unsatisfactory because the catalyst causes the plating resist solution to have a relatively short storage life at room temperature.

SUMMARY OF THE INVENTION

It is an object of this invention to provide an improved plating resist solution.

It is another object of this invention to provide a catalyst-free plating resist solution.

It is still another object of this invention to provide a solvent-free plating resist solution.

These and other objects are accomplished by a plating resist solution containing a diallyl phthalate prepolymer having a molecular weight of about 4922 plus or minus 500 and a liquid epoxy such as 1,2-epoxy ethylbenzene.

DESCRIPTION OF THE ILLUSTRATIVE EMBODIMENTS

In accordance with this invention, the composition of the plating resist solution contains a diallyl phthalate prepolymer and a liquid epoxy compound. The plating resist solution does not contain a catalyst or a solvent. The structure of the diallyl phthalate prepolymer is as follows:

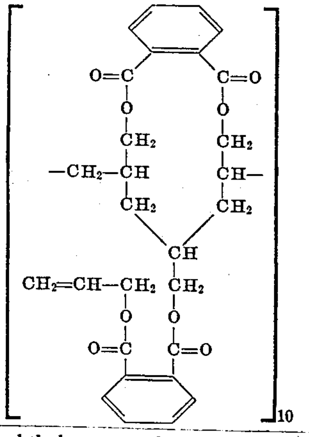

The diallyl phthalate prepolymer used in this solution is available commercially as Dapon 35. This prepolymer has a chain length in which the basic group is repeated about ten times resulting in a prepolymer having a molecular weight of about 4922. Prepolymers having a molecular weight of about 4500 to about 5400 are included in this invention with a preferred molecular weight being 4920.

The liquid epoxy compounds suitable for use in this invention have a structure of one of the following two types:

(I)

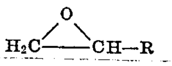

where R is benzene, substituted benzene, alkyl benzene containing one to four carbon atoms or epoxide.

(2)

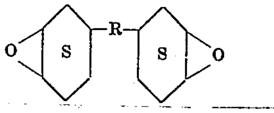

where R is methyl carboxylate.

Examples of liquid epoxy compounds of type (1) are butadiene diepoxide, 1, 2-epoxyethylbenzene, 1,2-epoxy-3-phenyl propane, 1,2-epoxy-4-phenyl butane, 1,2-4,5-diepoxypentane, and 4-(1,2-epoxy ethyl)-1,2-epoxycyclohexane.

Examples of liquid epoxy compounds of type (2) are 3,4 epoxycyclohexylmethyl-(3,4-epoxy) cyclohexane carboxylate, 1,3-bis-(3,4-epoxycyclohexylmethoxy) benzene and 1,2-bis-(3,4-epoxycyclohexylmethoxy) ethane.

The epoxy compounds are liquid compounds in which the diallyl phthalate prepolymer dissolves. The ratio of the liquid epoxy compound is the diallyl phthalate prepolymer is that for each gram of liquid epoxy compound there is from 0.1 to 3 grams of the diallyl phthalate prepolymer. The concentration of a diallyl phthalate prepolymer determines the viscosity of the plating resist solution. The higher the concentration of the diallyl phthalate prepolymer, the higher the viscosity of the plating resist solution. A relatively viscous plating resist solution would contain close to the maximum 3 grams of diallyl phthalate prepolymer per 1 gram of the liquid epoxy. Relatively nonviscous plating resist solutions would contain about 0.1 grams of diallyl phthalate prepolymer per 1 gram of epoxy. If the molecular weight of the diallyl phthalate prepolymer is higher than 4920, the quantity of diallyl phthalate prepolymer required for a given viscosity would be less. Similarly, if the molecular weight of the diallyl phthalate prepolymer is less than 4920, a larger quantity of the prepolymer would be required to obtain a given viscosity.

After the prepolymer is dissolved in the liquid epoxy compound, the resultant solution is applied to the substrate which is to be plated. As is the practice in this field, the plating resist is applied on to those surface areas which are not to be plated. Those areas which do not have the plating resist coating thereon will be plated.

The plating resist solution can be applied with a small camel hair brush (size 0000) or it may be applied by printing techniques. After the plating resist solution has been applied to the substrate, the resist layer is cured or polymerized by heating the substrate and layer to a temperature between about 70° to 200° C. A temperature of 150° to 170° C is preferred. The time required for curing depends upon the temperature. Twenty to thirty minutes is sufficient at the 150° to 170° C temperature. This plating resist solution is compatible with plating baths which are used to plate the substrate or units with gold.

The plating resist layer may be removed with acetone from the substrate before it has been cured. The resist layer may be removed after it has been cured by soaking in a hot (100° C) commercial resist remover solution.

EXAMPLE 1

Equal amounts by weight of 1,2-epoxy ethylbenzene and diallyl phthalate prepolymer (Dapon 35) were mixed together to form a homogeneous solution. The solution was applied to a substrate and cured at 175° C for thirty minutes. This resist solution did not flow during the curing cycle. The cured plating resist was bubble free and adhered tightly to the substrate surface.

EXAMPLE 2

A plating resist solution was prepared, applied and cured by the method set forth in Example 1 using butadiene diepoxide as the liquid epoxide compound. The cured resist layer was bubble free and adhered tightly to the substrate surface.

EXAMPLE 3

A plating resist solution was prepared, applied and cured by the method set forth in Example 1 using 3,4-epoxy cyclohexylmethyl - (3,4-epoxy) cyclohexane carboxylate as the liquid epoxide compound. The cured resist layer was bubble free and adhered tightly to the substrate surface.

One important advantage of the plating resist solution described herein is the relatively long storage life at room temperature due to the absence of catalysts therein. Solutions have been stored for 6 months without noting any deleterious storage effects. Another advantage is that the plating resist does not flow during the period in which the device is warmed up in order to polymerize the resist. This advantage is of extreme importance in plating micro devices. In addition, this plating resist can be printed on plating areas due to the ease of obtaining the desired viscosity by controlling the amount of the prepolymer added to the plating resist solution.

What is claim is:

1. A catalyst-free solvent-free mixture suitable for use as a plating resist solution consisting of diallyl phthalate prepolymer having a molecular weight of about 4500 to 5400 and a liquid epoxy selected from the group consisting of the following structures,

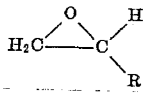

where R is benzene, substituted benzene and alkyl benzene containing 1 to 4 carbon atoms or an epoxide, and

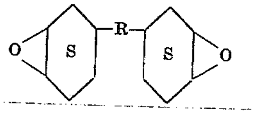

where R is a methyl carboxylate group.

2. A mixture described in claim 1 wherein 0.1 to 3 parts by weight of the diallyl phthalate prepolymer are used to 1 part by weight of the liquid epoxy.

3. A mixture as described in claim 1 wherein said liquid epoxy is 1-2 epoxy ethylbenzene.

4. A mixture as described in claim 1 wherein said liquid epoxy is 3-4 epoxycyclohexylmethyl - (3,4 - epoxy) cyclohexane carboxylate.

5. A mixture as described in claim 1 wherein said liquid epoxy has the following structure:

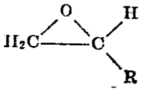

where R is benzene, substituted benzene and alkyl benzene containing 1 to 4 carbon atoms, or an epoxide.

6. A mixture as described in claim 1 wherein said liquid epoxy has the following structure:

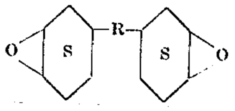

where R is a methyl carboxylate group.

7. A mixture as described in claim 1 wherein said diallyl phthalate prepolymer has the following structure:

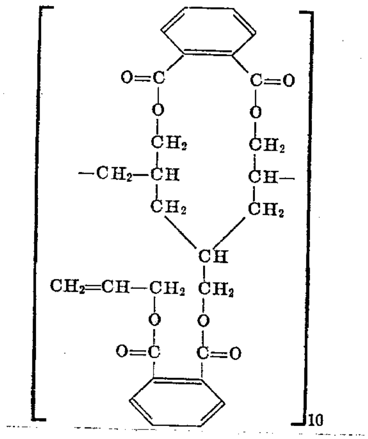

* * * * *